US007445460B1

(12) United States Patent
Fan et al.

(10) Patent No.: US 7,445,460 B1
(45) Date of Patent: Nov. 4, 2008

(54) ELECTRICAL CONNECTOR WITH CONTACT FALL-OUT PREVENTING ARRANGEMENT

(75) Inventors: Chia-Wei Fan, Tu-Cheng (TW); Nan-Hong Lin, Tu-Cheng (TW); Tod M. Harlan, Mechanicsburg, PA (US)

(73) Assignee: Hon Hai Precision Ind. Co., Ltd., Taipei Hsien (TW)

( * ) Notice: Subject to any disclaimer, the term of this patent is extended or adjusted under 35 U.S.C. 154(b) by 0 days.

(21) Appl. No.: 11/810,717

(22) Filed: Jun. 7, 2007

(51) Int. Cl.
*H01R 12/00* (2006.01)
*H05K 1/00* (2006.01)

(52) U.S. Cl. .......................................... 439/66; 439/71

(58) Field of Classification Search .................. 439/66, 439/71, 91, 591
See application file for complete search history.

(56) References Cited

U.S. PATENT DOCUMENTS

| | | | | |
|---|---|---|---|---|
| 6,293,805 | B1 * | 9/2001 | Wu | 439/66 |
| 6,814,587 | B2 * | 11/2004 | Ma | 439/66 |
| 6,866,520 | B2 * | 3/2005 | Chiang | 439/66 |
| 6,872,082 | B2 * | 3/2005 | Hsu et al. | 439/66 |
| 6,948,946 | B1 * | 9/2005 | Ju | 439/71 |

* cited by examiner

*Primary Examiner*—Hae Moon Hyeon
(74) *Attorney, Agent, or Firm*—Wei Te Chung

(57) ABSTRACT

An electrical connector comprises an insulative housing defining a mating interface and a mounting interface, a plurality of passageways arranged obliquely between the mating and mounting interfaces. A plurality of recesses is defined in the mating interface, and each is associated with a passageway. A plurality of contact each is assembled into a corresponding passageway. Each of the contacts includes a fall-out-preventing arrangement properly located within the recess limiting further downward movement of the contact within the passageway.

16 Claims, 8 Drawing Sheets

VI

ELECTRICAL CONNECTOR WITH CONTACT FALL-OUT PREVENTING ARRANGEMENT

BACKGROUND OF THE INVENTION

The present invention relates to an electrical connector, and more particularly to an electrical connector for electrically connecting two discrete electrical systems, such as two printed circuit boards. Moreover, the present invention provides an unique design for a contact unit which can be easily disposed within the housing, without falling out.

DESCRIPTION OF PRIOR ART

Electrical connection between two terminals is generally facilitated by normal force exerted from one terminal to the other. However, since surface of the terminal could be contaminated by dust or oxidation, it is preferable to generate a wiping displacement between two terminals during mating. With the wiping displacement between the terminals, dust or oxidation on the terminal could be wiped out, thereby ensuring reliable electrical connection between two mated terminals.

U.S. Pat. No. 5,244,396 issued to Matsuoka on Sep. 14, 1993 discloses an arrangement for electrical connector in which contact 9 is obliquely arranged and which may provide a wiping displacement between contact 9 and element 4. However, Matsuoka's device is too complicated to implement.

In Matsuoka device, element 11 is insert molded within element 1, while contact 9 is moveably arranged within the element 11. The contact 9 includes a pair of arms 8 which can be deformed when the contact 9 is pushed downwardly by element 4. As stated above, the Matsuoka device is too complicated to be implemented in the socket connector for used with a CPU. (U.S. Pat. No. 6,083,022 discloses another oblique arrangement of the contacts in the connector housing)

U.S. Pat. No. 5,820,389 issued to Hashiguchi on Oct. 13, 1998, discloses an electrical connector to be used between a printed circuit board and a LSI (Large Scale Integration) circuit of the type which is disclosed in Japanese Utility Model Publication (B) No. 13191/1995 (hereinafter referred to as the '191 Publication). Since the '191 device can not provide enough wiping displacement between the contacting end and a corresponding conductive pad, Hashiguchi (the '389 patent) then provides an improvement on the arrangement of the contact such that a contact end thereof may perform an effective wiping displacement over a corresponding pad to ensure an effective electrical connection.

As shown in FIGS. 9A, 9B and 9C, the contact 20 is arranged in a passageway formed vertically in the housing 10. The contact 20 includes an extension 24 having a free end 24*b*. Theoretically, when contact end 23*a* is depressed by the element 200, contact end 24*b* will displace from its original position. It is understandable that Hashiguchi device is better than the '191 device as the extension 24 displace more than that of the '191 device. However, since the contact 20 is vertically arranged within the passageway, it is unlikely that the contact end 23*a* to perform a wiping displacement with respect to the corresponding element 200. Understandably, Hashiguchi solves only portion of the problem encountered by the '191.

On the other hand, even the extension 24 is arranged obliquely, the wiping displacement conducted by the contact end 24*b* is still not enough since before the contact end 24*b* is moved when the portion 23*a* is moved vertically down, there is a deformation incurred in portion 21*a*. Accordingly, Hashiguchi still leaves an opening for further improvement.

By the way, Hashiguchi does not meet the requirement since only the contact end 24*b* displaces a short distance over a conductive pad, while the contact end 23 does not displace when it is contacting with corresponding conductive pad.

U.S. Pat. No. 6,447,304 issued to Korsunsky provides a solution to the above described prior arts. Even it reaches to its intended purpose, as the contact 12, as shown in FIG. 5A, may easily fall out as lack of proper positioning device.

As such, there is a room for providing a design for contact met the requirement from the industry.

SUMMARY OF THE INVENTION

It is therefore an object of the present invention to provide an electrical connector, which provides enough wiping displacement between the contacting end and a corresponding conductive pad and proper positioning of the contacts.

An electrical connector to which this invention is applicable is provided. The electrical connector comprises an insulative housing defining a mating interface and a mounting interface, a plurality of passageways arranged obliquely between the mating and mounting interfaces. A plurality of recesses is defined in the mating interface, and each is associated with a passageway. A plurality of contact each is assembled into a corresponding passageway. Each of the contacts includes a fall-out-preventing arrangement properly located within the recess limiting further downward movement of the contact within the passageway. Each of the contacts includes a base portion, an upper contact engaging arm extending from the base portion and forming an upper bent serving as a contacting point; a lower contact engaging arm extending from the base portion and forming a lower bent serving as a contacting point.

According to the invention, the contact has an upper contacting point and a lower contacting point such that provides enough wiping displacement between contacting end and a corresponding conductive pad. According to the invention, the contact includes a fall-out-preventing arrangement properly located with the recess such that ensures the contacts to be proper secured in passageway.

DETAILED DESCRIPTION OF THE PREFERRED EMBODIMENT OF THE INVENTION

Figure 1:
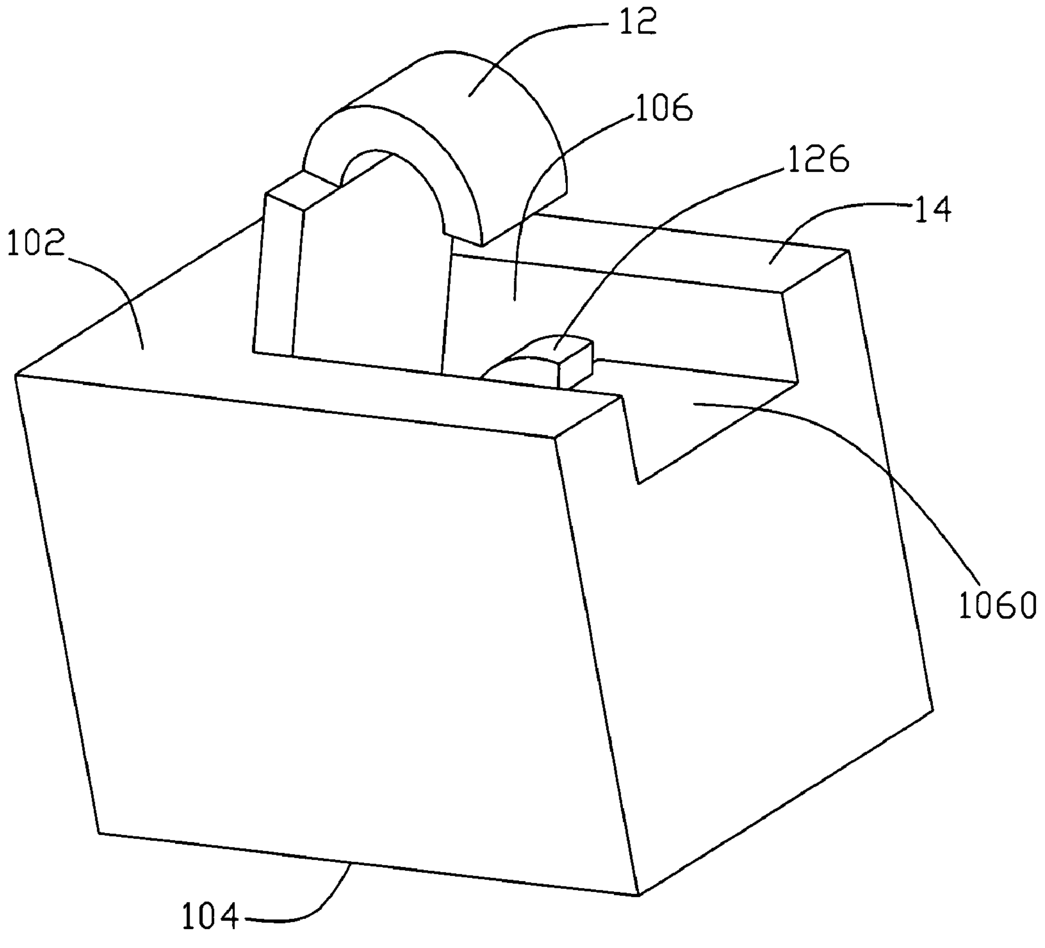
FIG. 1 is an assembled view of a contact assembled in a housing unit in accordance with a preferred embodiment of the invention.
Figure 2:
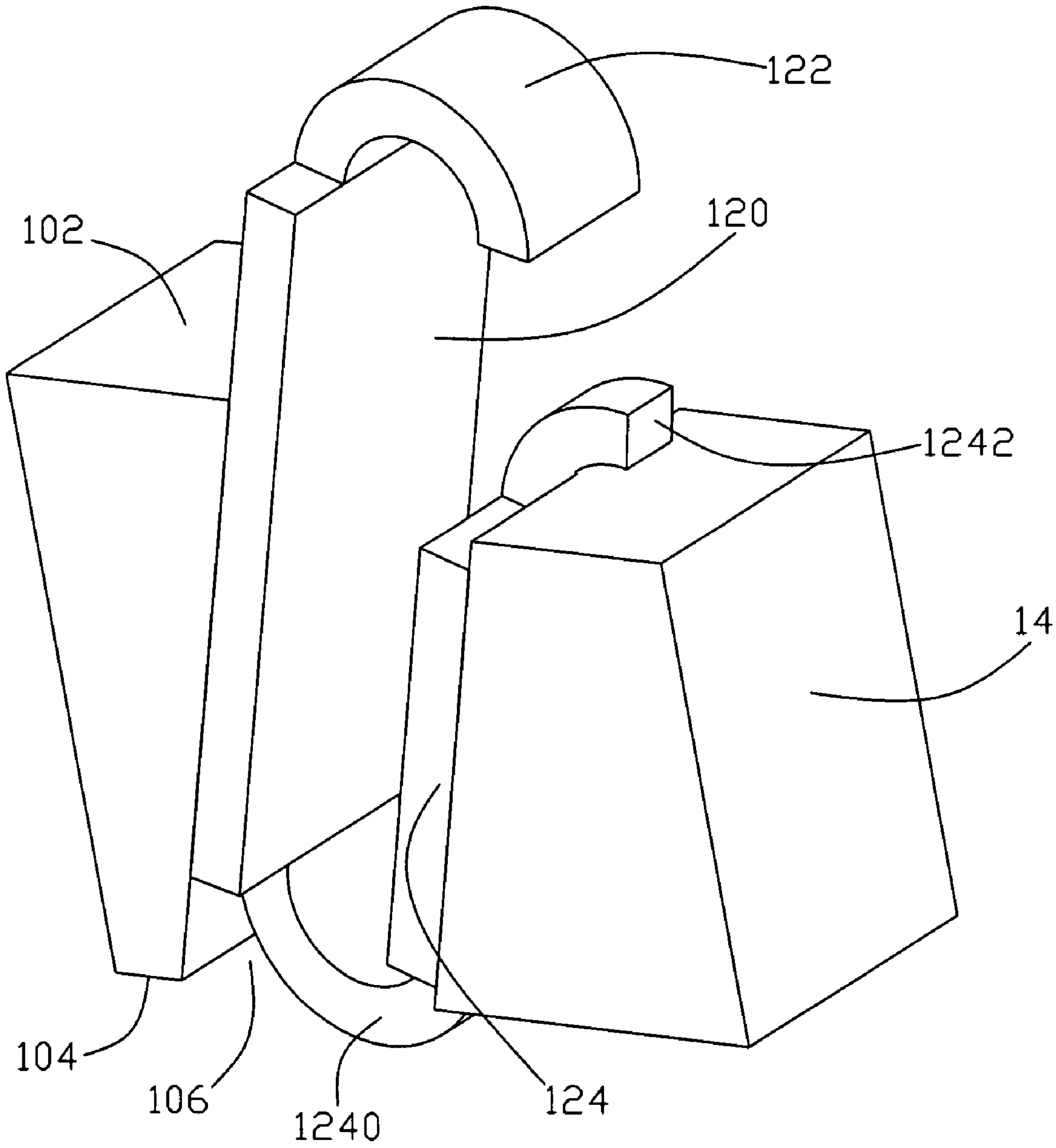
FIG. 2 is an assembled view of a portion of a housing with a contact received therein in accordance with a preferred embodiment of the invention.
Figure 3:
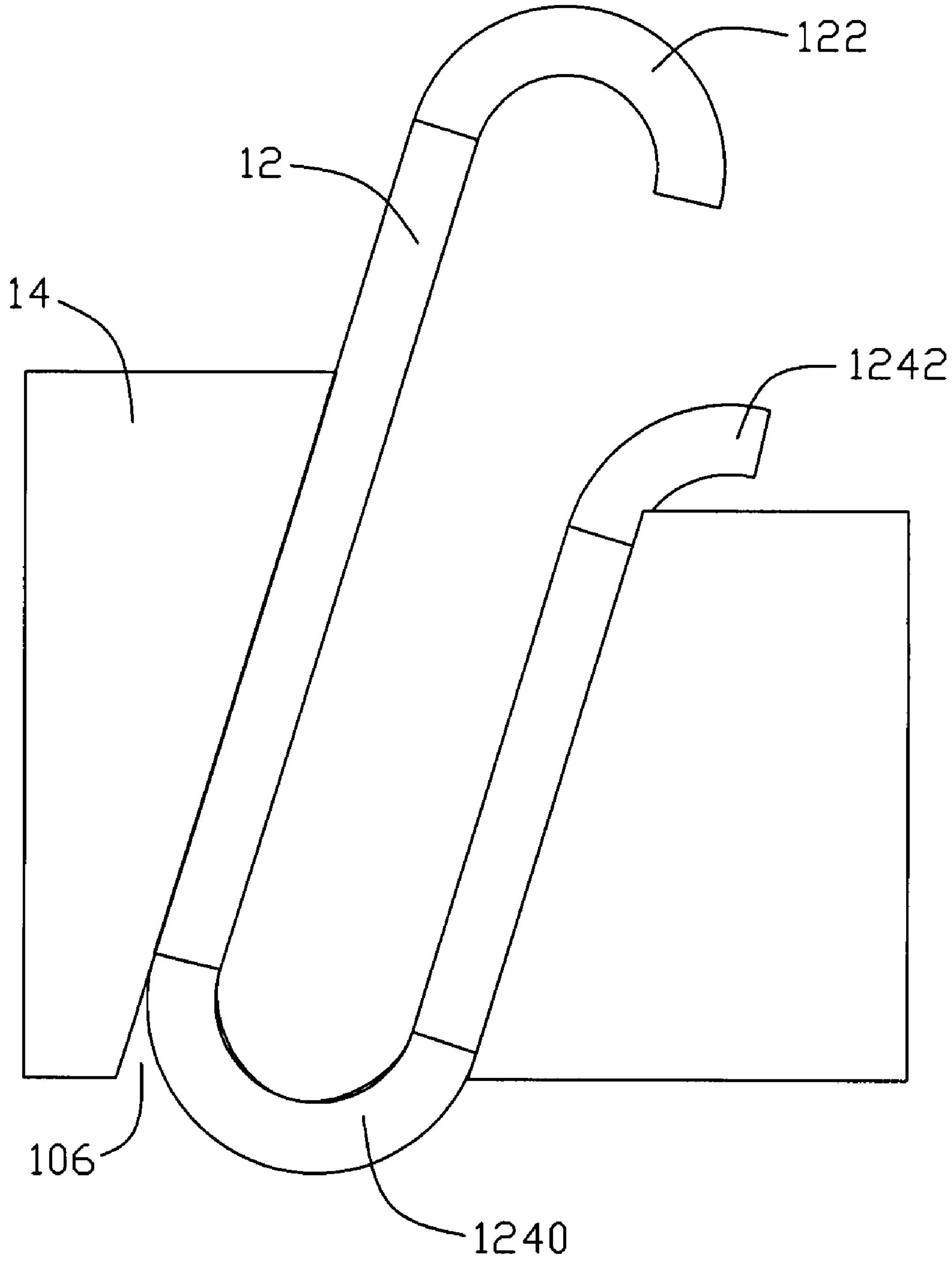
FIG. 3 is a front side view of the contact received in the housing shown in FIG. 2.
Figure 4:
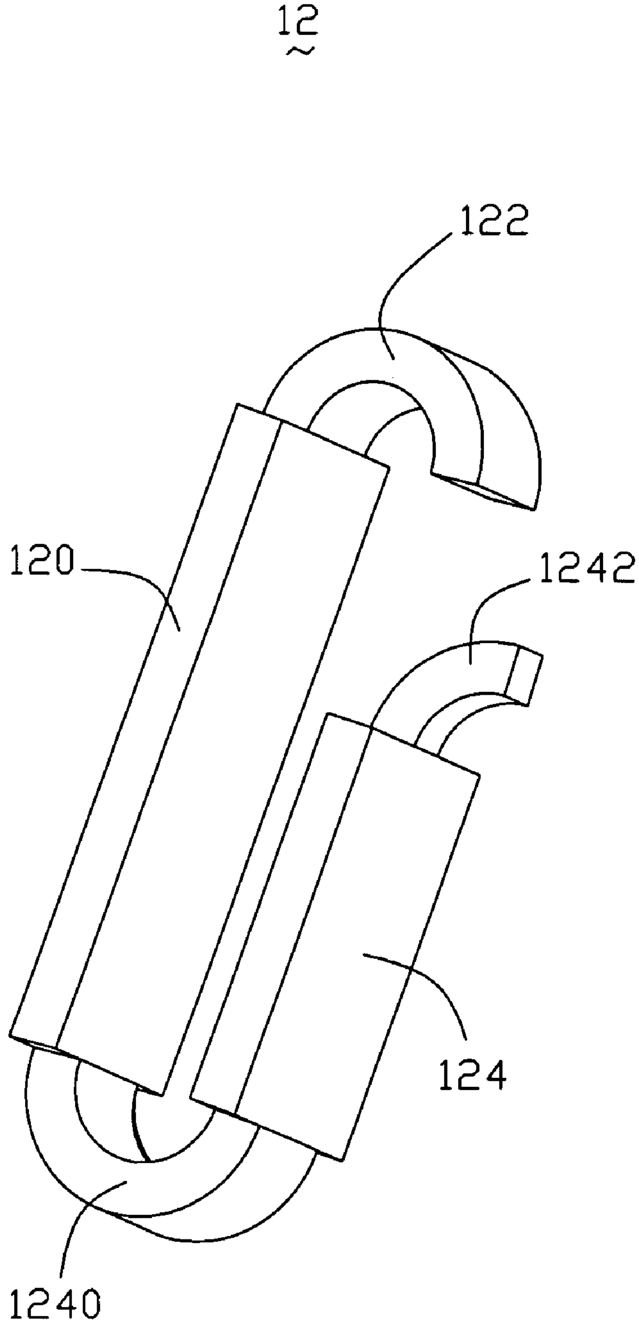
FIG. 4 is an isometric view of the contact shown in FIG. 1 in accordance with a preferred embodiment of the invention.
Figure 5:
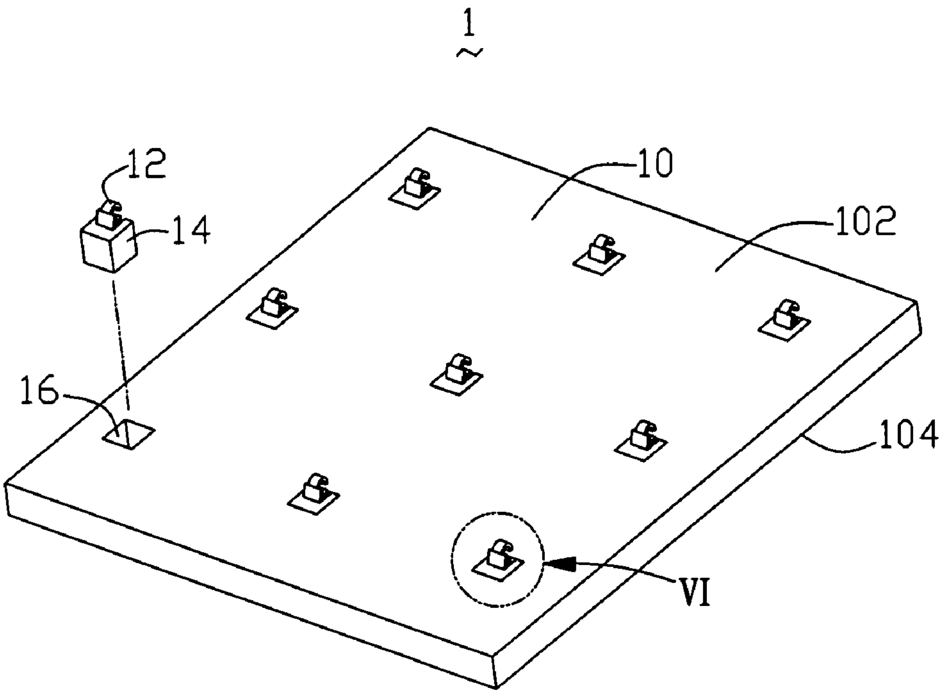
FIG. 5 is an assembled view of a portion of the electrical connector having contacts according to a preferred embodiment of the invention.
Figure 6:
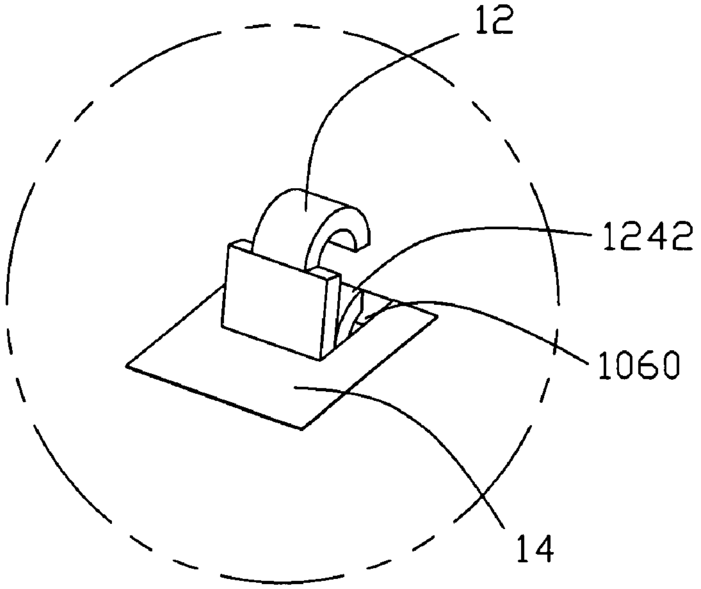
FIG. 6 is an enlarged view of a circle VI shown in FIG. 5.
Figure 7:
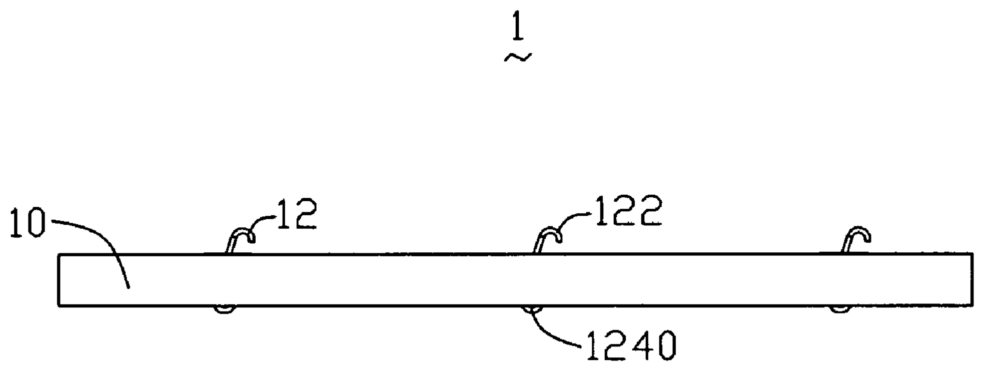
FIG. 7 is a side view of the electrical connector shown in FIG. 5.
Figure 8:
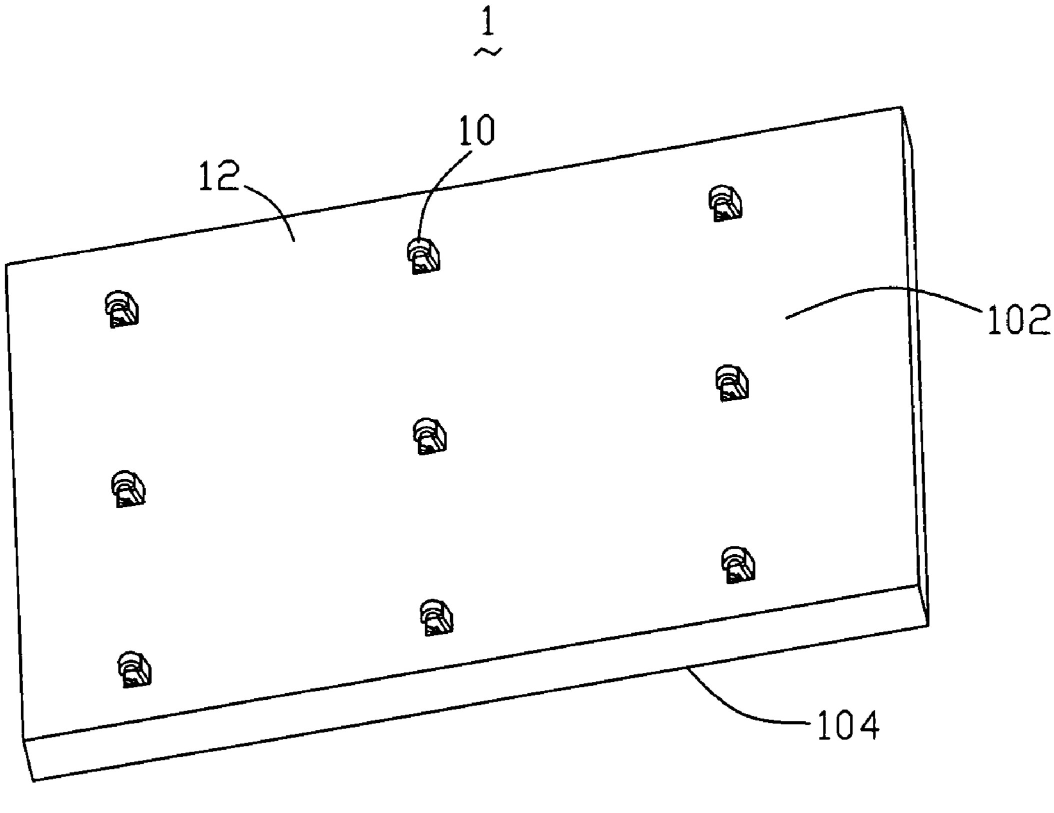
FIG. 8 is an assembled view of a portion of an electrical connector in accordance with a preferred embodiment of the invention.
Figure 9:
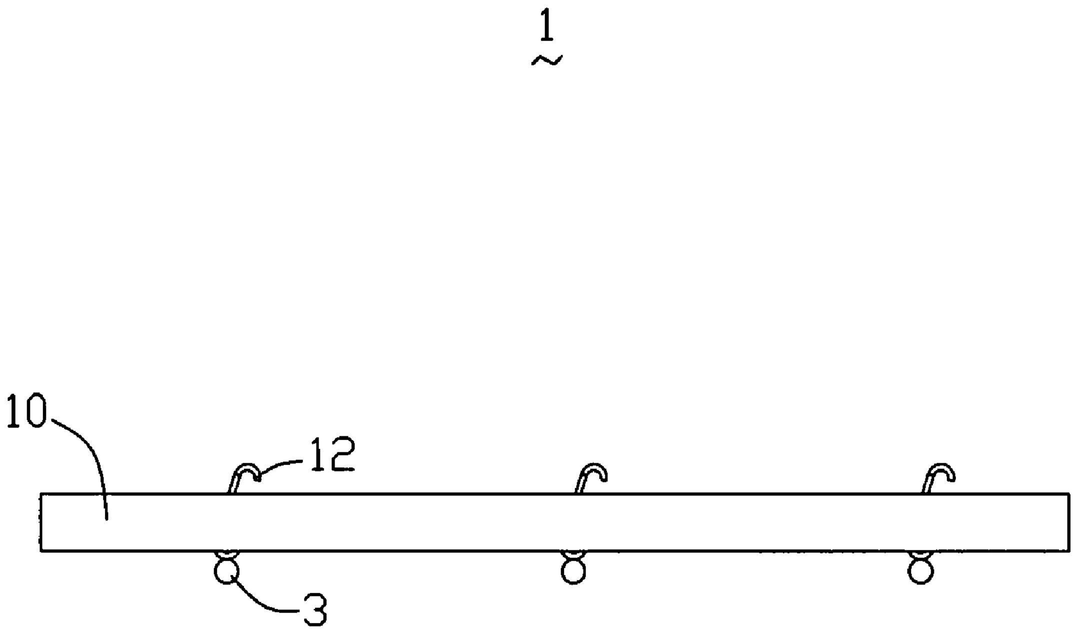
FIG. 9 is a side view of the electrical connector shown in FIG. 8.
Figure 10:
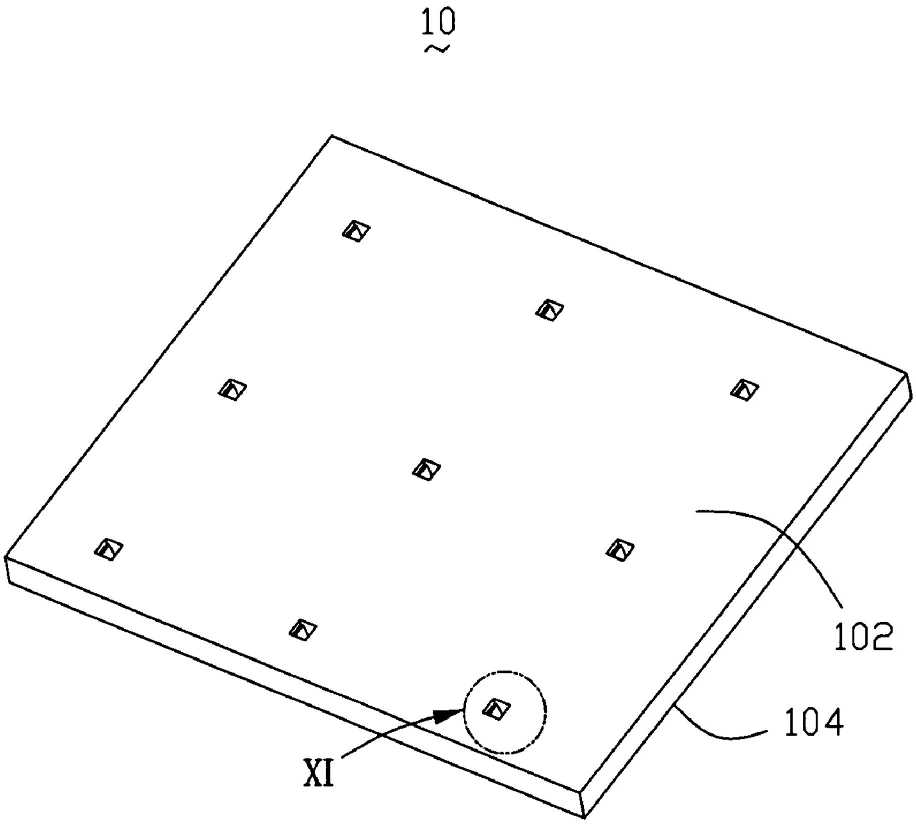
FIG. 10 is a isometric view of a portion of the insulative housing of an electrical connector according to a preferred embodiment of the invention.

Referring to FIGS. 1-8, an electrical connector 1 according to an embodiment of the present invention includes a insulative housing 10 with a number of apertures 16 therethrough, a number of contact assembly each comprising a contact 12 and a housing unit 14 received in the corresponding apertures 16 each defining a passageway 106 extending between a mating interface and mounting interface 102, 104 for receiving the contact 12 therein.

The electrical connector 1 is arranged between a first and a second substrates. According to the preferred invention, the first substrate is a circuit board having at least one conductive pad thereon, while the second substrate is a chip module (e.g. CPU) having a plurality of conductive pads thereon.

The housing unit 14 defines a mating interface 102 facing the chip module and a mounting interface 104 facing the printed circuit board, and a passageway 106 extending obliquely through the mating interface 102 and the mounting interface 104 for receiving the contacts 12 therein. Each passageway 106 defines a recess 1060 in one side thereof and has a contact 12 received therein. Each passageway 106 includes several inner walls, and the recess 1060 is associated with an inner wall of the passageway 106.

The contact 12 includes a base portion 120, an upper contact engaging arm 122 extending from the base portion 120, a lower contact engaging arm 124 extending from the base portion 120, and a fall-out-preventing arrangement 126 extending from a free end of the lower arm contact engaging arm 124. The upper contact engaging arm 122 has a free end, which is generally of an U-shaped structure. The lower contact engaging arm 124 has a lower bent 1240 contacting with the base portion 120, a main portion extending therefrom upwardly and parallel to the base portion 120. The base portion 120 is used for abutting against with the inner wall of the passageway 106 and like wise for the main portion of the lower engaging arm 124. The fall-out-preventing arrangement 1242 extends from the free end of the lower contact engaging arm 124; so as to form a hook structure or the like.

When the contacts 12 are inserted into the passageway 106 of the housing unit 14, and the housings unit 14 are arranged into apertures 16 of the insulative housing 10. The free end of the upper contact engaging arm 122 extends upwardly beyond the mating interface 102 for contacting with the corresponding pads of an chip module (not shown) and the lower bent 1240 of the lower contact engaging arm 124 extends downwardly beyond the mounting interface 104 for contacting with the corresponding pads of a circuit board (not shown). Thus, the free end of the upper contact engaging arm 122 forms a contacting point and the lower bent 1240 of the lower contact engaging arm 124 forms a contacting point, too. The fall-out-preventing arrangement 1242 is properly located within the recess 1060 limiting further downward movement of the contact 12 within the passageway 106.

Figure 11:
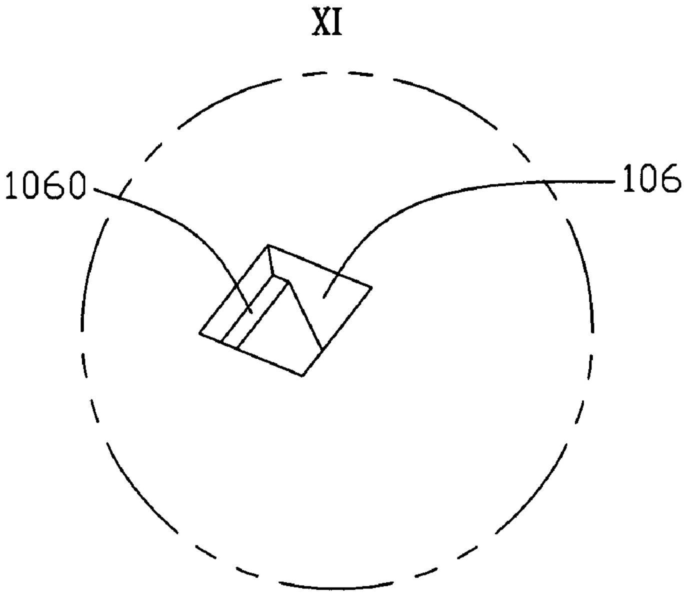
FIG. 11 is an enlarged view of a circle 11 shown in FIG. 10.

It must be pointed out, the lower bent 1240 of the lower engaging arm 124 contacts with the pads of a circuit board via face contact. When the electrical connector 1 having contact 12 is mounted onto a circuit board, the lower bent 1240 wipe across the pads of the circuit and are deflected. During the deflection, the lower bent 1240 exerts a normal force on the pads, thus ensuring the proper electrical contact between the lower bent 1240 and the pads. Additional, the lower bent 1240 may be soldered to the contact directly or via a solder mass, for instance, a solder ball 3. As shown in FIG. 11, the lower bent 1240 of the lower contact engaging arm 124 is attached with a solder ball 3 for soldering on a circuit board, thus electrical contact between the lower bent 1240 and the pads being established.

Referring to FIGS. 8-11, an electrical connector 1 according to another embodiment of the present invention is disclosed. The electrical connector 1 includes an insulative housing 10 and a plurality of contacts 12 received in the housing 10.

The housing 10 defines a mating interface 102, a mounting interface 104, and a plurality of passageways 106 arranged therebetween for receiving the contacts 12. Each passageway 106 defines a recess 106 in one sidewall thereof. As mentioned above, the contact 12 includes a base portion 120, an upper contact engaging arm 122 extending from the base portion 120, a lower contact engaging arm 124 extending from the base portion 120, and a fall-out-preventing arrangement 126 extending from a free end of the lower arm contact engaging arm 124. The upper contact engaging arm 122 has a free end, which is generally of an U-shaped structure. The lower contact engaging arm 124 has a lower bent 1240 contacting with the base portion 120, a main portion extending therefrom upwardly and parallel to the base portion 120. The base portion is used for abutting against with the inner wall of the passageway 106 and like wise for the main portion of the lower engaging arm 124. The fall-out-preventing arrangement 1242 extends from the free end of the lower contact engaging arm 124; so as to form a hook structure or the like. Obviously, the fall-out-preventing arrangement 1242 could be located within the mating surface 102 directly, so as to prevent the contact 12 from falling off the passageway 106.

When the contacts 12 are inserted into the passageway 106 of the housing unit 10, the free end of the upper contact engaging arm 122 extends upwardly beyond the mating interface 102 for contacting with the corresponding pads of an chip module (not shown) and the lower bent 1240 of the lower contact engaging arm 124 extends downwardly beyond the mounting interface 104 for contacting with the corresponding pads of a circuit board (not shown). Thus, the free end of the upper contact engaging arm 122 forms a contacting point and the lower bent 1240 of the lower contact engaging arm 124 forms a contacting point, too. The fall-out-preventing arrangement 1242 is properly located within the recess 1060 limiting further downward movement of the contact 12 within the passageway 106.

We claim:

1. An electrical connector comprising:

an insulative housing assembly defining opposite upper and lower surfaces and a plurality of contact receiving passageways extending in the housing assembly and through said upper and lower surfaces along an oblique direction;

a plurality of contacts disposed in the corresponding passageways, respectively, each of said contacts defining an italic U-shaped configuration having a first arm and a second arm linked by a bight section wherein one of said first and second arm forms a hook at an upper distal end to be engaged with the housing assembly for preventing downward withdrawal of the contact from the housing assembly, the other of said first and second arm forms an upper contacting section and the bight section forms a lower contacting section respectively engaged with the complementary parts located around the upper and lower surfaces.

2. The connector assembly as claimed in claim 1, wherein the arm having the contacting section thereon, extends higher than the other arm.

3. The connector assembly as claimed in claim 2, wherein the U-shaped configuration is in an oblique form.

4. The connector assembly as claimed in claim 3, wherein the arm having the hook thereon, abuts against a corresponding wall of the housing assembly in an acute angular manner with regard to the lower surface.

5. The connector assembly as claimed in claim 1, wherein the bight section, the contacting section, the hook are dimensioned smaller than the remainder of the contact.

6. The connector assembly as claimed in claim 1, wherein the housing assembly defines a plurality of recesses beside the corresponding passageways, respectively around the upper surface for respective engagement with the corresponding hooks.

7. An electrical connector, comprising:

an insulative housing defining a plurality of apertures extending therethrough;

a plurality of housing units, each assembled into a corresponding aperture, each housing unit defining a mating interface, a mounting interface, and a passageway extending obliquely between the mating and mounting interface;

each passageway defining a recess associated with an inner wall of the passageway;

a plurality of contacts, each assembled into a corresponding passageway of the housing unit;

wherein each contacts defining a hook properly located within the recess limiting further downward movement of the contact within the passageway.

8. The electrical connector as recited in claim 7, wherein each contact includes a base portion with an upper contact engaging arm extending above the mating interface.

9. The electrical connector as recited in claim 8, wherein the base portion includes a lower contact engaging arm extending beyond the mounting interface.

10. The electrical connector as recited in claim 9, wherein the lower contact engaging arm is attached with a solder mass.

11. The electrical connector as recited in claim 10, wherein the solder mass is a solder ball.

12. The electrical connector as recited in claim 9, wherein the hook extends from a free end of the upper contact engaging arm.

13. The electrical connector as recited in claim 12, wherein the lower contact engaging arm is substantially in parallel to the base portion within the housing.

14. An electrical contact, comprising:

a first arm and a second arm parallel to the first arm, the two arms linked by a bight section;

an upper contact engaging point extending from the first arm along a direction toward the second arm;

a lower contact engaging point formed at a bottom end of the bight section;

a hook formed at a distal end of the second arm and extending away from the first and second arms.

15. The electrical contact as recited in claim 14, wherein the lower contact engaging point is disposed below any remainder of the contact.

16. The electrical contact as recited in claim 14, wherein the upper contact engaging point extends higher than the hook.

* * * * *